United States Patent [19]

Tam et al.

[11] Patent Number: 5,460,986
[45] Date of Patent: Oct. 24, 1995

[54] PROCESS FOR MAKING A POWER MOSFET DEVICE AND STRUCTURE

[75] Inventors: Gordon Tam; Pak M. Tam, both of Gilbert, Ariz.

[73] Assignee: Motorola, Inc., Schaumburg, Ill.

[21] Appl. No.: 297,075

[22] Filed: Aug. 29, 1994

[51] Int. Cl.[6] .......................... H01L 21/265; H01L 29/78
[52] U.S. Cl. .................... 437/40; 437/44; 437/45; 437/150; 437/913; 437/933; 437/953; 257/341; 257/412; 257/328
[58] Field of Search .................... 257/341, 412, 257/328; 437/40, 44, 45, 150, 913, 933, 953

[56] References Cited

U.S. PATENT DOCUMENTS

| | | | |
|---|---|---|---|
| 4,484,388 | 11/1984 | Iwasaki et al. | 29/571 |
| 4,830,974 | 5/1989 | Chang et al. | 437/34 |
| 5,141,895 | 8/1992 | Pfiester et al. | 437/162 |
| 5,189,504 | 2/1993 | Nakayama et al. | 257/422 |
| 5,304,831 | 4/1994 | Yilmaz et al. | 257/341 |

OTHER PUBLICATIONS

Goodenough, Frank, "Submicron Process Yields P–Channel Power MOSFETs that Turn On At −2.7V", *Electronic Design*, Feb. 18, 1993.

*Primary Examiner*—Edward Wojciechowicz
*Attorney, Agent, or Firm*—Kevin B. Jackson

[57] ABSTRACT

A method for making a stable low threshold voltage p-channel power MOSFET device having a p-type gate layer (14) includes incorporating a p-type dopant into the gate layer (14) formed over a gate oxide layer (13). The p-type dopant is incorporated within the gate layer (14) under conditions that minimize diffusion of p-type dopant through the gate oxide layer (13) into the channel regions (31, 32). The process reduces the number of process steps necessary to manufacture a power MOSFET device.

11 Claims, 2 Drawing Sheets

PROCESS FOR MAKING A POWER MOSFET DEVICE AND STRUCTURE

BACKGROUND OF THE INVENTION

This invention relates, in general, to a method for making semiconductor power devices, and more particularly, to a process for making a power MOSFET semiconductor device.

Typically, power semiconductor manufacturers fabricate p-channel power MOSFET devices with polysilicon gate layers that are doped with an n-type dopant. The polysilicon gate layers typically are formed and doped with a n-type dopant early in the manufacturing process (e.g., before forming the n-type high voltage (NHV) regions). With this process, the polysilicon gate layers must then be protected during the formation of the p-type source regions to prevent the incorporation of p-type dopant into the gate layers.

With n-type polysilicon gate layers, p-channel devices have higher threshold voltages than n-channel devices made with equivalent processing. This is because of the work function difference between the n-type polysilicon gate layer and the underlying p-type substrate. To reduce the threshold voltage of p-channel devices, some power semiconductor manufacturers have resorted to sub-micron processing and p-channel shape redesign while maintaining n-type polysilicon gate layers. However, these techniques require significant capital investment and complex processing steps.

Manufacturers of large scale integrate (LSI) low voltage CMOS structures have found that using boron-doped gate regions for p-channel devices reduces the threshold voltage difference between p-channel and n-channel devices. However, because boron diffuses at a much faster rate than n-type dopants such as phosphorous, manufacturers must exercise great care to prevent boron from diffusing from the polysilicon gate region through the gate oxide layer into the underlying channel region. An unstable device can result when boron is present in the channel region under the gate oxide. To reduce boron diffusion, U.S. Pat. No. 5,189,504 shows a process where inert impurities such as carbon or nitrogen are incorporated with boron into the polysilicon gate layer during polysilicon deposition. This process has a disadvantage because a manufacturer must control the concentrations of the various constituents, which adds to process complexity. Thus, there exists a need for a p-channel power MOSFET device that has a lower threshold voltage, that exhibits stable device characteristics, and that uses less complex processing techniques.

SUMMARY OF THE INVENTION

Briefly stated, a process for making a power MOSFET device comprises selectively forming first and second regions of a second conductivity type in a substrate of a first conductivity type. A gate oxide layer is formed over a first surface of the substrate above a portion of the first region, a portion of the second region and a portion of substrate between the first and second regions. A gate layer is formed over the gate oxide layer. A first conductivity type dopant is incorporated into the gate layer and portions of the first and second regions. The substrate is then heated to distribute the first conductivity type dopant within the gate layer to form a first conductivity type gate region and to distribute the first conductivity type dopant in the first and second regions to form first and second source regions. The substrate is heated under time and temperature conditions that minimize diffusion of the first conductivity type dopant into the channel region below the gate oxide layer.

The power MOSFET structure described herein comprises a p-type substrate having first and second n-type regions extending from a first surface. A portion of the substrate separates the first and second n-type regions. A thin oxide layer covers a portion of the first surface including a portion of the first n-type region, a portion of the second n-type region, and the portion of the substrate between the first and second n-type regions. A gate layer covers the thin oxide layer, wherein the p-type dopant is incorporated into the gate layer under time and temperature conditions that minimize diffusion of the p-type dopant into channel region below the thin oxide layer. The gate layer forms a p-type gate region. A first p-type source regions is formed in the first n-type region and second p-type source region is formed in the second n-type region. The substrate forms a drain region.

DETAILED DESCRIPTION OF THE DRAWINGS

A method of manufacturing a power MOSFET device will now be described in conjunction with the figures. An understanding of the present invention can be obtained through the explanation of the manufacturing of a single power MOSFET device as shown in the figures. However, it will be understood that a power MOSFET device may contain many such devices. To simplify the explanation, conventional process steps will described only briefly, while those steps relating to the novel aspects of the process will be described in greater detail.

The process according to the present invention is preferred for manufacturing a low threshold voltage p-channel power MOSFET device because of the inherent challenges in making a stable p-channel device with a p-type semiconductor gate layer. The process will be explained using a p-channel device. However, because the process according to the present invention uses a simplified approach, it is understood that the process also can be used to manufacture a n-channel power MOSFET device with a n-type semiconductor gate layer.

Figure 1:
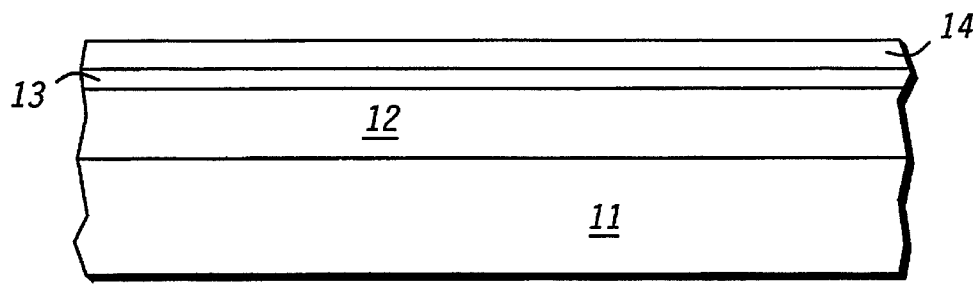
FIGS. 1–6 illustrate cross-sectional views of a device at various stages of processing according to the present invention.

FIG. 1 illustrates a cross-sectional view of a small portion of a semiconductor material or substrate 11. Substrate 11 has a p-type conductivity and optionally includes p-type semiconductor layer 12 formed on an upper surface. P-type semiconductor layer 12 is formed using epitaxial growth techniques for example. Preferably, p-type semiconductor layer 12 has a p-type dopant concentration that is less than the p-type dopant concentration in substrate 11. When substrate 11 is used without p-type semiconductor layer 12, substrate 11 forms a drain region for the power MOSFET device. When p-type semiconductor layer 12 is used, p-type semiconductor layer 12 forms the drain region and substrate 11 forms a portion of the drain contact.

The p-type dopant concentration of p-type semiconductor layer 12 varies depending upon the desired breakdown voltage of the power MOSFET device. For example, for breakdown voltages in the range of 12 to 60 volts, the dopant concentration for p-type semiconductor layer 12 is in the range of 3E17 to 1E16 atoms/cm$^3$ respectively.

A thin oxide or gate oxide layer 13 is formed over the upper surface of p-type semiconductor layer 12. Gate oxide layer 13 is formed using conventional oxide formation techniques. Preferably gate oxide layer 13 comprises a thermally grown silicon oxide formed at a temperature in the range of 800° to 1000° C. and has a thickness in the range of 100 to 1000 angstroms.

Optionally, a p-type dopant is introduced or incorporated into the upper surface p-type semiconductor layer 12 to provide for a threshold voltage adjustment. For example, boron is implanted into the upper surface at an implant dose in the range of 1.0E12 to 5.0E12 atoms/cm$^2$ preferably using a screen oxide. If a screen oxide is used, the screen oxide is removed prior to forming gate oxide layer 13.

Next a gate layer 14 is formed over gate oxide layer 13. Preferably, gate layer 14 comprises polysilicon or amorphous silicon and is formed using conventional chemical vapor deposition (CVD) techniques. Preferably, when gate layer 14 comprises polysilicon, gate layer 14 is deposited under reduced pressure at a temperature in the range of 620° to 700° C. and at a growth rate in the range of 20 to 110 angstroms/minute. When gate layer 14 comprises amorphous silicon, gate layer 14 is deposited under reduced pressure at a temperature in the range of 550° to 600° C. and at a growth rate in the range of 20 to 110 angstroms/minute. Preferably, gate layer 14 has a thickness in the range of 2000 to 5000 angstroms.

Figure 2:
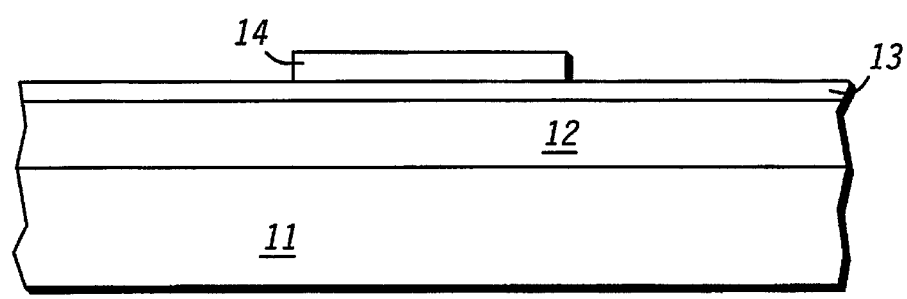

FIG. 2 illustrates gate layer 14 after patterning. Conventional photolithographic and etch techniques are used to pattern gate layer 14.

Figure 3:
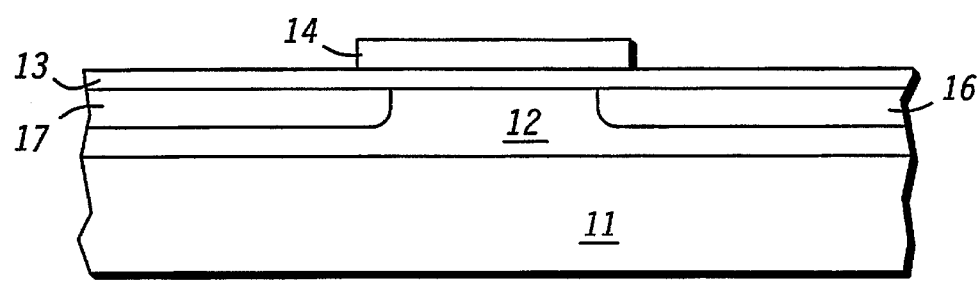

FIG. 3 illustrates the formation of n-type high voltage (NHV) or n-type regions 16 and 17 in p-type semiconductor layer 12. N-type regions 16 and 17 are formed using conventional doping techniques. Preferably, phosphorus ion implantation is used to form n-type regions 16 and 17 with an implant dose in the range of 1.0E13 to 1.0E14 atoms/cm$^2$. The implant energy is selected so that the majority of n-type dopant penetrates the selected thickness of gate oxide layer 13. Gate layer 14 acts as a mask to prevent n-type dopant from being introduced into a portion of p-type semiconductor layer 12 below gate layer 14. Optionally, gate layer 14 is covered with a protective layer during the implant step. However, it is preferred that a protective layer not be used to reduce processing steps.

After ion implantation, the n-type dopant is distributed to the desired depth using conventional thermal processing techniques. When p-type semiconductor layer 12 is used, the depth of n-type regions 16 and 17 is less than the thickness or depth of p-type semiconductor layer 12. The actual depth of n-type regions 16 and 17 depends upon the desired breakdown voltage of the MOSFET device.

Figure 4:
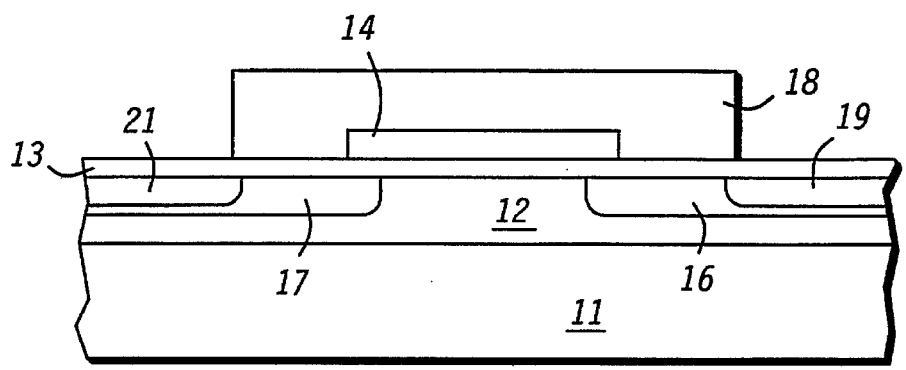

FIG. 4 illustrates the formation of optional n-type regions 19 and 21. A protective layer 18 is used to provide a pattern for forming n-type regions 19 and 21. N-type dopant is incorporated into n-type regions 16 and 17 using protective layer 18 as a mask. Preferably, phosphorus ion implantation is used with an implant dose in the range of 1.0E15 to 7.0E15 atoms/cm$^2$. This implant dose range results in n-type regions 19 and 21 having a higher dopant concentration than n-type regions 16 and 17. The implant energy is selected so that the majority of n-type dopant penetrates the selected thickness of gate oxide layer 13. When ion implantation is used to form n-type regions 19 and 21, protective layer 18 comprises photoresist for example.

After ion implantation, the n-type dopant is distributed to the desired depth using conventional thermal processing techniques to form n-type regions 19 and 21. When protective layer 18 comprises photoresist, protective layer 18 is removed before the n-type dopant is distributed. Preferably, the depth of n-type regions 19 and 21 is less than the depth of n-type regions 16 and 17. N-type regions 19 and 21 are optional but preferred because they reduce the effects of the inherent parasitic bipolar devices formed by p-type semiconductor layer 12, n-type region 16, and source region 23 (shown in FIG. 5) and p-type semiconductor layer 12, n-type region 17, and source region 24 (shown in FIG. 5).

Figure 5:
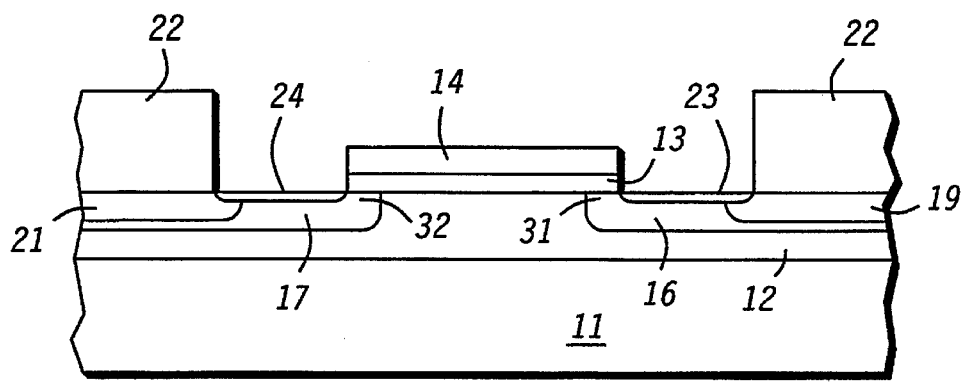

FIG. 5 illustrates the formation of p-type source regions 23 and 24 and the p-type doping of gate layer 14. First, a portion of exposed gate oxide layer 13 is removed leaving a remaining portion of gate oxide layer 13 below gate layer 14. Next, a protective layer 22 is formed to provide the desired pattern for forming p-type source regions 23 and 24 and doping gate layer 14. P-type dopant is then incorporated into n-type regions 16 and 17 to form source regions 23 and 24 and incorporated into gate layer 14 to form a p-type gate region.

Preferably, boron ion implantation is used with an implant dose in the range of 1.0E15 to 1.0E16 atoms/cm$^2$ to simultaneously provide dopant for source regions 23 and 24 and dopant for gate layer 14. Preferably, a $BF_2$ boron source is used for boron ion implantation to minimize the penetration of boron into n-type regions 16 and 17. The boron implant dose is selected to provide a boron concentration high enough to compensate for any n-type dopant present in gate layer 14 from the formation of n-type regions 16 and 17. When gate layer 14 and source regions 23 and 24 are formed simultaneously, process complexity and costs are reduced because masking steps are eliminated.

After the implantation step, substrate 11 is heated or exposed to an elevated temperature to distribute the p-type dopant in n-type regions 16 and 17 to the desired depth to form source regions 23 and 24 and to distribute the p-type dopant in gate layer 14 to form a p-type gate region or layer. Channel region 31 is formed in n-type region 16 below gate layer 14 and is between source region 23 and the portion of p-type semiconductor layer 12 between n-type regions 16 and 17. Channel region 32 is formed in n-type region 17 below gate layer 14 and is between source region 24 and the portion of p-type semiconductor layer 12 between n-type regions 16 and 17.

To provide for a stable device, substrate 11 is exposed to an elevated temperature for a time that prevents or minimizes incorporation or diffusion of the p-type dopant from gate layer 14 through gate oxide layer 13 into channel regions 31 and 32. For example, when gate layer 14 is on the order of 2000 to 5000 angstroms thick, and when a boron implant dose on the order of 5E15 atoms/cm$^2$ is used, substrate 11 is exposed to a temperature in the range of 750° to 950° C. for approximately 30 to 180 minutes.

After substrate 11 is heated to distribute the p-type dopant in gate layer 14, exposure of substrate 11 to elevated temperatures above 950° C. is avoided or minimized to prevent or reduce subsequent diffusion of p-type dopant from gate layer 14 through gate oxide layer 13 into channel regions 31 and 32. This is achieved with the process according to the present invention because the p-type dopant is incorporated into gate layer 14 with the formation of source regions 23 and 24, which is typically the final high temperature process step.

In a second embodiment, n-type regions 16 and 17 and n-type regions 19 and 21 are formed using conventional processing. Gate oxide layer 13 is then formed on the upper surface of p-type semiconductor layer 12. Next, gate layer 14 is formed over gate oxide layer 13. Gate layer 14 and gate oxide 13 are then patterned so that they cover a portion of n-type region 16 and a portion of n-type region 17 and a portion of p-type semiconductor layer 12 between n-type regions 16 and 17. Next, protective layer 22 is formed and patterned as shown in FIG. 5. P-type dopant is then incorporated into n-type regions 16 and 17 to form source regions 23 and 24 and incorporated into gate layer 14 to form the p-type gate region.

Figure 6:
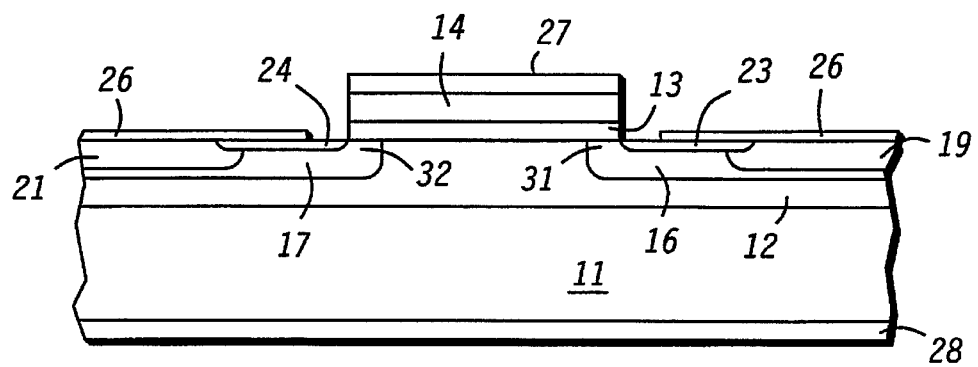

FIG. 6 illustrates the formation of source metal layers 26, gate metal layer 27, and drain metal layer 28. In a preferred embodiment, source metal layers 26 and gate metal layer 27 comprise an aluminum/silicon alloy and drain metal layer 28 is a multiple layer metallization comprising titanium, nickel, and silver. These metal layers are formed using conventional process techniques. It is understood that additional passivation layers may be added before or after the formation of source metal layers 26, gate metal layer 27, and drain metal layer 28. However, any elevated temperature processing after the incorporation of p-type dopant into gate layer 14 is minimized or avoided to reduce or prevent subsequent diffusion of p-type dopant through gate oxide layer 13 into channel regions 31 and 32.

By now it should be appreciated that there has been provided a process for making a power MOSFET device. By incorporating a p-type dopant into the gate layer and by distributing the p-type dopant under time and temperature conditions that minimize the diffusion of p-type dopant through the gate oxide layer into the underlying channel regions, a stable, low threshold voltage p-channel power MOSFET device is achieved. Also, by doping the gate layer with p-type dopant near the end of the process, a stable device is achieved because subsequent high temperature processing avoided or minimized. In addition, by not masking the gate layer during the formation of the NHV regions and by doping the gate layer during the formation of the source regions, process steps and costs are reduced.

We claim:

1. A method for making a p-channel power MOSFET device having a p-type gate region and a low threshold voltage comprising the steps of:

providing a semiconductor substrate having a p-type conductivity and a p-type semiconductor layer formed on a surface of the semiconductor substrate, wherein the p-type semiconductor layer has an upper surface and dopant concentration less than the semiconductor substrate;

forming a gate oxide layer over the upper surface of the p-type semiconductor layer;

forming a gate layer over the gate oxide layer;

selectively patterning the gate layer to form a gate region;

forming a first and second n-type regions extending from the upper surface, wherein the gate region acts as a mask to prevent n-type dopant from being introduced into a portion of the p-type semiconductor layer below the gate region;

forming a first masking layer over the gate region and portions of the first and second n-type regions adjacent the gate region;

forming a third n-type region in an unmasked portion of the first n-type region;

forming a fourth n-type region in an unmasked portion of the second n-type region;

thereafter introducing a p-type dopant into the gate region and selective areas of the first and second n-type dopant present in the gate region; and exposing the semiconductor substrate to an elevated temperature to distribute the p-type dopant in the gate region, to form a first p-type source region in the first n-type region, and to form a second p-type source region in the second n-type region, wherein the p-type semiconductor layer forms a drain region.

2. The method of claim 1 wherein the step of selectively forming the first and second n-type regions includes:

implanting an n-type dopant into the p-type semiconductor layer, wherein the gate region masks the n-type dopant from the gate oxide layer and the portion of the p-type semiconductor layer below the gate region; and heating the semiconductor substrate to distribute the n-type dopant in the p-type semiconductor layer to form the first and second n-type regions.

3. The method of claim 2 wherein the step of implanting the n-type dopant includes implanting phosphorous in a range of 1.0E13 to 1.0E14 atoms/cm$^2$.

4. The method of claim 1 further comprising the steps of:

selectively forming a third n-type region in the first n-type region, extending from the upper surface, wherein the first source region is between the third n-type region and the portion the p-type semiconductor layer separating the first and second n-type regions; and selectively forming a fourth n-type region in the second n-type region, extending from the upper surface, wherein the second source region is between the fourth n-type region and the portion of the p-type semiconductor layer separating the first and second n-type regions.

5. The method of claim 1 wherein the third and fourth n-type regions are formed simultaneously.

6. The method of claim 1 further including:

forming a screen oxide layer on the upper surface;

incorporating a p-type dopant through the screen oxide layer into the upper surface; and removing the screen oxide layer before the step of forming the gate oxide layer.

7. The method of claim 6 wherein the step of incorporating the p-type dopant includes implanting boron at an implant dose in a range of 1.0E12 to 5.0E12 atoms/cm$^2$.

8. The method of claim 1 wherein the step of incorporating the p-type dopant includes implanting boron at an implant dose in a range of 1.0E15 to 1.0E16 atoms/cm$^2$.

9. The method of claim 1 wherein the step of forming the gate layer includes forming gate layer using a material selected from the group consisting of polysilicon and amorphous silicon, wherein the gate layer has a thickness in a range of 2000 to 5000 angstroms.

10. The method of claim 1 wherein the step of forming the gate oxide layer includes forming a silicon oxide layer having a thickness in a range of 100 to 1000 angstroms.

11. The method of claim 1 further comprising the steps of:

forming a source metal layer in selectively exposed areas of the first and second source regions;

forming a gate metal layer over the gate region; and forming a drain metal layer over a back surface of the semiconductor substrate.

* * * * *

UNITED STATES PATENT AND TRADEMARK OFFICE
CERTIFICATE OF CORRECTION

PATENT NO. : 5,460,986
DATED : October 24, 1995
INVENTOR(S) : Gordon Tam
　　　　　　　Pakming Tam It is certified that error appears in the above-indentified patent and that said Letters Patent is hereby corrected as shown below:

Claim 1, column 5, line 45
Insert --a-- after "and" therefor.

Claim 1, column 6, line 1
Insert after "n-type" --regions at a concentration sufficient to compensate n-type-- therefor.

Signed and Sealed this

Fourteenth Day of October, 1997

Attest:

BRUCE LEHMAN

Attesting Officer　　　Commissioner of Patents and Trademarks